(12) United States Patent
Yoshida (10) Patent No.: US 7,374,961 B2
(45) Date of Patent: May 20, 2008

(54) INSULATED GATE FIELD-EFFECT TRANSISTOR AND ITS MANUFACTURING METHOD, AND IMAGING DEVICE AND ITS MANUFACTURING METHOD

(75) Inventor: Hiroyuki Yoshida, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/524,749

(22) PCT Filed: Aug. 18, 2003

(86) PCT No.: PCT/JP03/10408

§ 371 (c)(1),
(2), (4) Date: Feb. 15, 2005

(87) PCT Pub. No.: WO2004/017416

PCT Pub. Date: Feb. 26, 2004

(65) Prior Publication Data

US 2005/0269636 A1    Dec. 8, 2005

(30) Foreign Application Priority Data

Aug. 19, 2002  (JP) .............................. 2002-237838

(51) Int. Cl.
*H01L 21/00* (2006.01)
(52) U.S. Cl. .................... 438/48; 257/290; 257/291
(58) Field of Classification Search ................ 257/347, 257/291, 292; 438/48
See application file for complete search history.

(56) References Cited

U.S. PATENT DOCUMENTS 5,220,190 A * 6/1993 Taguchi et al. ............. 257/499

(Continued)

FOREIGN PATENT DOCUMENTS

EP    517164    12/1992

(Continued)

OTHER PUBLICATIONS

Japanese Office Action issued on Feb. 27, 2007.

*Primary Examiner*—Phat X. Cao
*Assistant Examiner*—Abul Kalam
(74) *Attorney, Agent, or Firm*—Sonnenschein Nath & Rosenthal LLP (57) ABSTRACT

An insulated gate field effect transistor, a solid-state image pickup device using the same, and manufacturing methods thereof that suppress occurrence of a shutter step and suppress occurrence of punch-through and injection. An insulated gate field effect transistor (30) having a gate electrode (32) on a semiconductor substrate (11) with a gate insulating film (31) interposed between the semiconductor substrate (11) and the gate electrode (32), and having a source region (33) and a drain region (34) formed in the semiconductor substrate (11) on both sides of the gate electrode (31), the insulated gate field effect transistor including: a first diffusion layer (12) of a P type formed in the semiconductor substrate (11) at a position deeper than the source region (33) and the drain region (34); and a second diffusion layer (13) of the P type having a higher concentration than the first diffusion layer (12) and formed in the semiconductor substrate (11) at a position deeper than the first diffusion layer (12). The insulated gate field effect transistor can be used for a part or all of insulated gate field effect transistors forming an output circuit of a solid-state image pickup device and formed in a semiconductor substrate.

1 Claim, 9 Drawing Sheets

U.S. PATENT DOCUMENTS

| | | | |
|---|---|---|---|
| 5,808,333 A * | 9/1998 | Maruyama et al. | 257/290 |
| 6,023,293 A * | 2/2000 | Watanabe et al. | 348/294 |
| 6,051,857 A * | 4/2000 | Miida | 257/292 |
| 6,218,691 B1 * | 4/2001 | Chung et al. | 257/290 |
| 6,630,719 B2 * | 10/2003 | Roche | 257/393 |
| 6,864,543 B2 * | 3/2005 | Kaneko et al. | 257/371 |

FOREIGN PATENT DOCUMENTS

| | | |
|---|---|---|
| JP | 04-357873 | 12/1992 |
| JP | 05-335564 | 12/1993 |
| JP | 07-297295 | 11/1995 |
| JP | 2001-230406 | 8/2001 |
| JP | 2002-8388 | 3/2002 |
| JP | 2002-083888 | 3/2002 |

* cited by examiner

INSULATED GATE FIELD-EFFECT TRANSISTOR AND ITS MANUFACTURING METHOD, AND IMAGING DEVICE AND ITS MANUFACTURING METHOD

The present invention relates to an insulated gate field effect transistor and a method of manufacturing the same, and an image pickup device and a method of manufacturing the same, and particularly to an insulated gate field effect transistor and a method of manufacturing the same, and an image pickup device and a method of manufacturing the same that prevent occurrence of punch-through and injection.

Conventionally, MOS and MONOS transistors forming an output circuit of a CCD image pickup element use a depleted back gate to obtain high gain.

Figure 9:
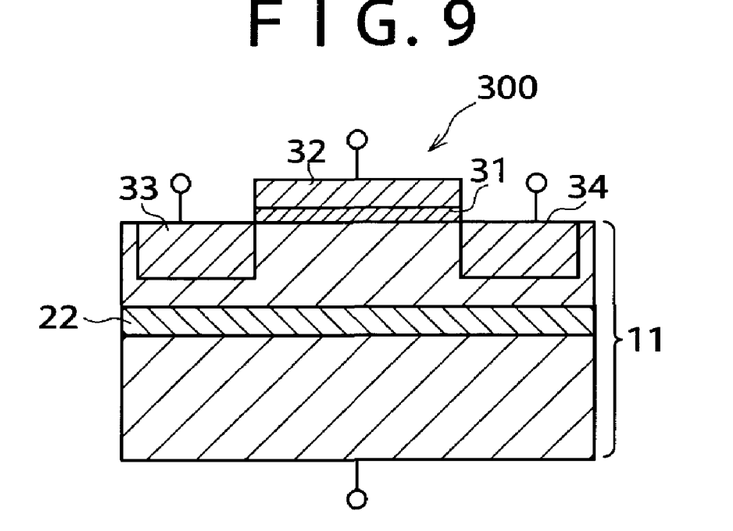
FIG. 9 is a schematic structure sectional view of a drive transistor used in an output circuit of a conventional image pickup device.

A conventionally known drive transistor forming an output circuit of a CCD (charge-coupled type) image pickup element will be described with reference to a schematic structure sectional view of FIG. 9. As shown in FIG. 9, a gate electrode 32 is formed on an N type semiconductor substrate 11 with a gate insulating film 31 interposed between the N type semiconductor substrate 11 and the gate electrode 32. A source region 33 and a drain region 34 of a P type are formed in the semiconductor substrate 11 on both sides of the gate electrode 32. In addition, a P+ type diffusion layer 22 is formed in the semiconductor substrate 11 at a position deeper than the source region 33 and the drain region 34. The drive transistor 300 is thus formed.

Figure 10:
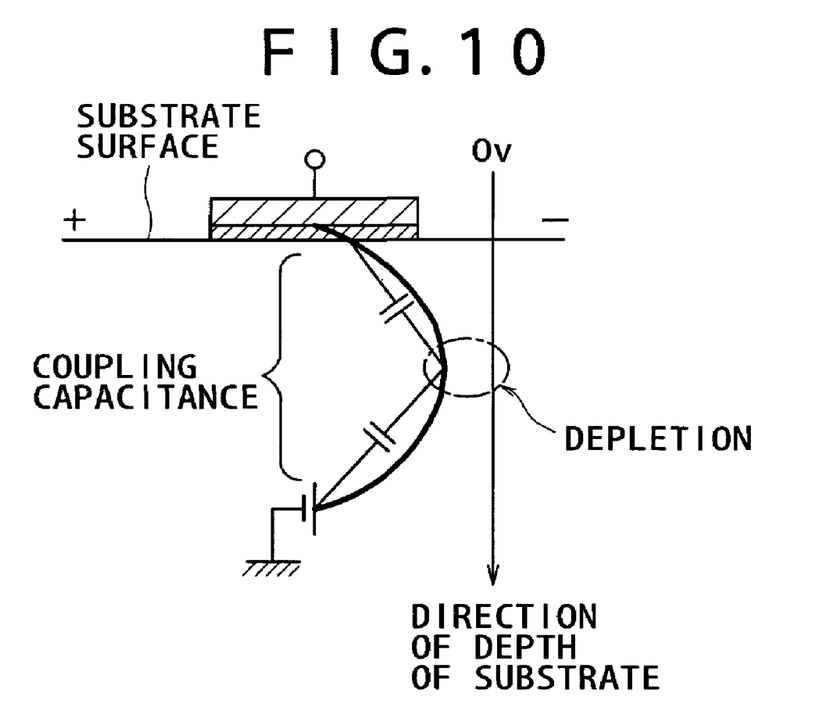
FIG. 10 is a potential diagram showing potential under a channel of the conventional drive transistor.

Potential under a channel of the drive transistor 300 will be described with reference to a potential diagram of FIG. 10. As shown in FIG. 10, the drive transistor 300 has a depleted back gate to obtain high gain as a source follower type output circuit.

Figure 11:
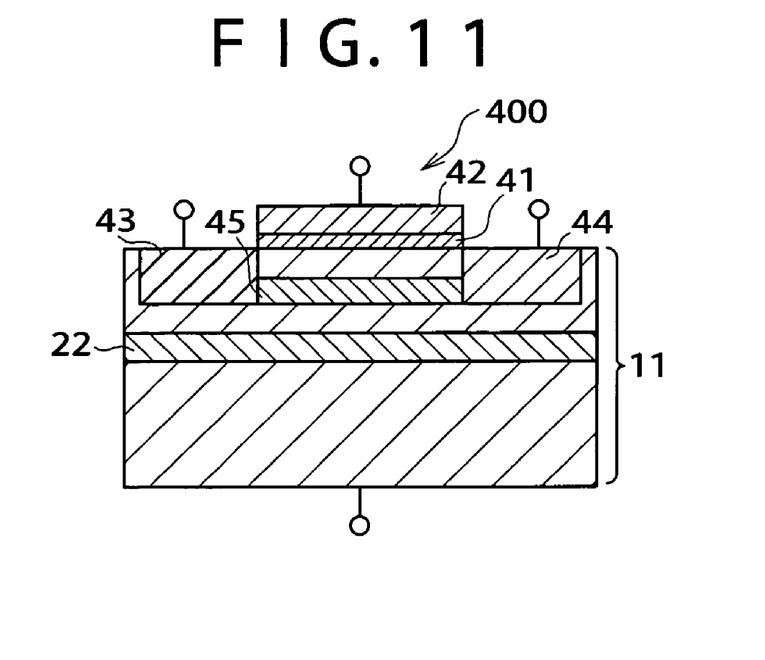
FIG. 11 is a schematic structure sectional view of a constant-current transistor used in an output circuit of a conventional image pickup device.

A conventionally known constant-current transistor of an output circuit of a CCD image pickup device will next be described with reference to a schematic structure sectional view of FIG. 11. As shown in FIG. 11, a gate electrode 42 is formed on an N type semiconductor substrate 11 with a gate insulating film 41 interposed between the N type semiconductor substrate 11 and the gate electrode 42. A source region 43 and a drain region 44 of a P type are formed in the semiconductor substrate 11 on both sides of the gate electrode 42. An N+ type diffusion layer 45 is formed between the source region 43 and the drain region 44 in the semiconductor substrate 11 with a region of the semiconductor substrate 11 left on the gate electrode 42 side. Further, a P+ type diffusion layer 22 is formed in the semiconductor substrate 11 at a position deeper than the source region 43 and the drain region 44. The constant-current transistor 400 is thus formed.

Figure 12:
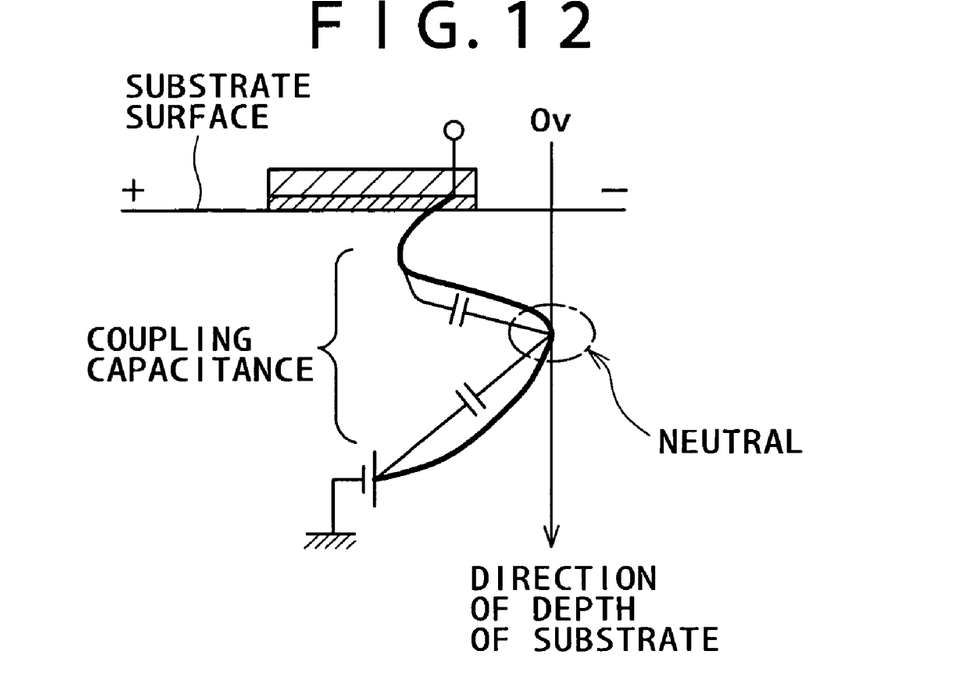
FIG. 12 is a potential diagram showing potential under a channel of the conventional constant-current transistor.

Potential under a channel of the constant-current transistor 400 will be described with reference to a potential diagram of FIG. 12. As shown in FIG. 12, a back gate of the constant-current transistor 400 is in a so-called neutral state (a zero potential state). In addition to the constant-current transistor 400 having the neutral back gate because no gain is required, there is a constant-current transistor 400 with a depleted back gate. A comparison between the potential of the drive transistor 300 shown in FIG. 10 and the potential of the constant-current transistor 400 shown in FIG. 12 indicates that channel potential differs in order to obtain an optimum operating point in consideration of gain and frequency characteristics and that coupling capacitance differs.

Figure 13:
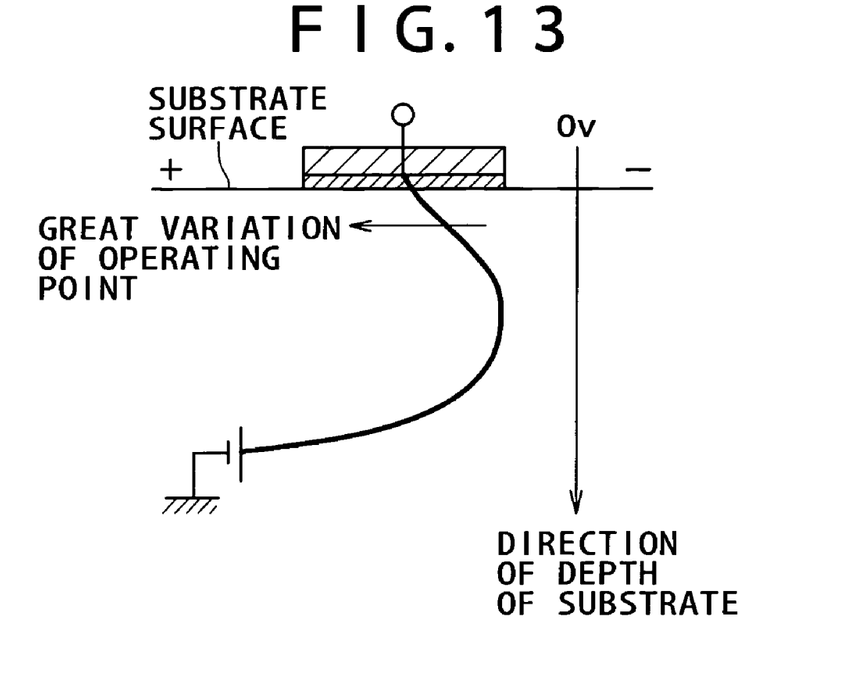
FIG. 13 is a potential diagram showing potential under a channel of the conventional drive transistor at the time of application of an electronic shutter.
Figure 14:
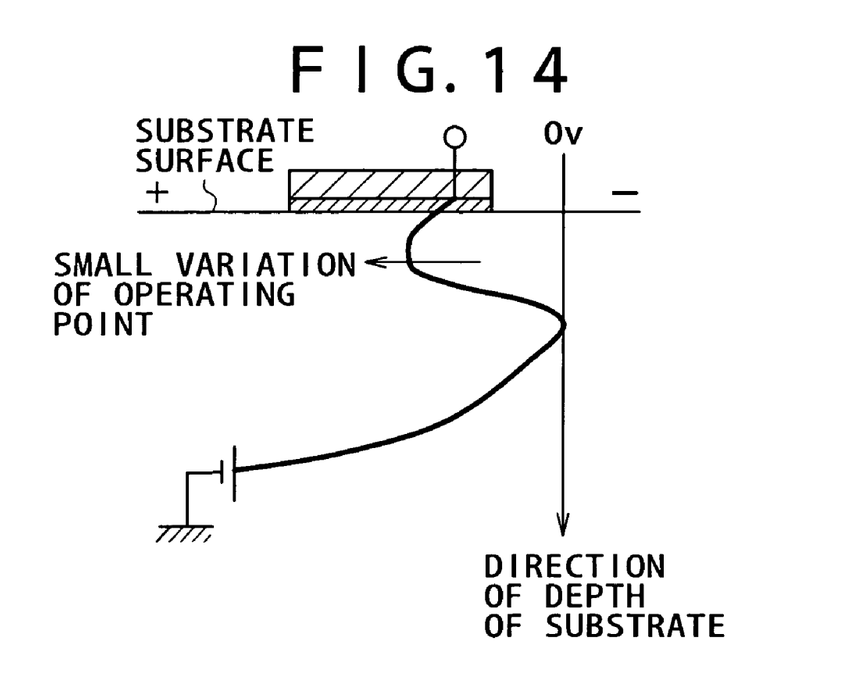
FIG. 14 is a potential diagram showing potential under a channel of the conventional constant-current transistor at the time of application of an electronic shutter.

Further, the drive transistor and the constant-current transistor differ from each other in coupling capacitance between the substrate and the channel. A potential diagram of FIG. 13 showing potential under the channel of the drive transistor 300 at the time of application of an electronic shutter and a potential diagram of FIG. 14 showing potential under the channel of the constant-current transistor 400 at the time of application of the electronic shutter show that there appears a difference in back gate effect on the channel. When the electronic shutter is applied in this state, the operating point of the output circuit is varied, and thus a "shutter step," which refers to a step-like level difference appearing in quality of a picked-up image, occurs.

Figure 15:
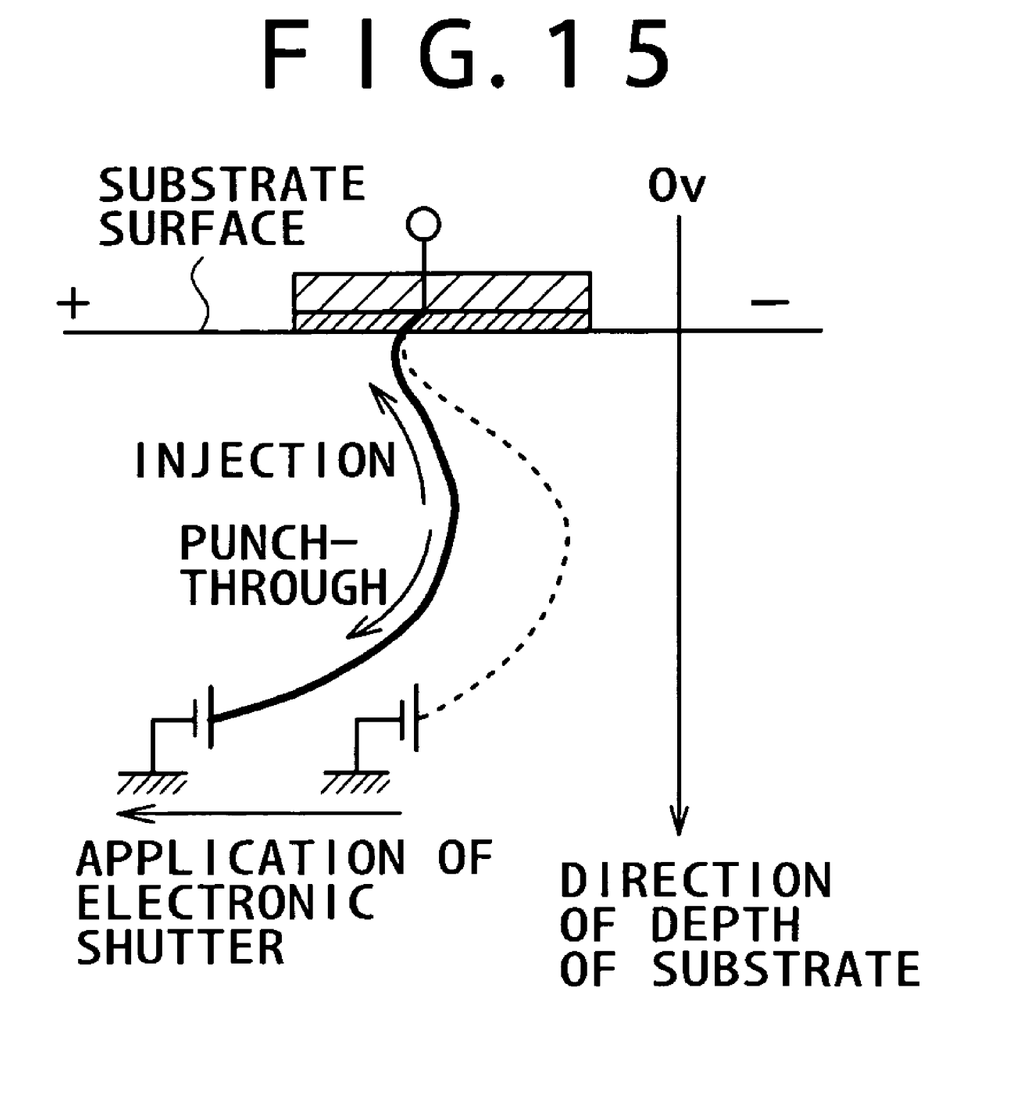
FIG. 15 is a potential diagram showing potential under a channel of a conventional reset gate transistor at the time of application of an electronic shutter.

In addition, insulated gate field effect transistors such as MOS transistors, MONOS transistors and the like included in a CCD image pickup device are diversified, so that there are various forms of operating point and channel potential. For example, there is a transistor requiring high gain characteristics for a purpose, such for example as a reset gate having a similar structure as that of FIG. 11. FIG. 15 is a potential diagram showing potential under a channel of such a conventional reset gate transistor at the time of application of an electronic shutter. In the drawing, a potential curve represented by a broken line is a potential curve before the application of the electronic shutter, and a potential curve represented by a solid line is a potential curve after the application of the electronic shutter. After the application of the electronic shutter, potential difference is reduced, and therefore punch-through from the channel to the substrate or injection from the substrate to the channel tends to occur.

However, the source follower drive transistor and the constant-current transistor in the output circuit of an image pickup device differ from each other in potential of the back gate in order to obtain an optimum operating point in consideration of gain and frequency characteristics. Therefore, when the electronic shutter is applied, a phenomenon occurs in which output level is varied due to difference in the back gate effect between the drive transistor and the constant-current transistor (hereinafter referred to as a "shutter step"), and a problem of step-like output difference appearing in quality of a picked-up image tends to occur.

Moreover, the channel potential of the constant-current transistor has recently been increased for still higher gain, so that punch-through from the channel to the substrate tends to occur. Furthermore, various circuits such as a bias circuit and the like have been included in a CCD image pickup device. Depending on a purpose, some reset gates and transistors forming these circuits have a depleted back gate for high gain. These transistors also tend to cause punch-through and injection from the substrate.

It is an object of the present invention to provide an insulated gate field effect transistor, an image pickup device using the same, and manufacturing methods thereof that suppress occurrence of a shutter step and suppress occurrence of punch-through and injection.

SUMMARY OF THE INVENTION

The present invention is an insulated gate field effect transistor and a method of manufacturing the same, and an image pickup device and a method of manufacturing the same that are invented to solve the above problems.

According to the present invention, there is provided an insulated gate field effect transistor having a gate electrode on a semiconductor substrate with a gate insulating film interposed between the semiconductor substrate and the gate electrode, and having a source region and a drain region formed in the semiconductor substrate on both sides of the gate electrode, the insulated gate field effect transistor including: a first diffusion layer of a P type formed in the semiconductor substrate at a position deeper than the source region and the drain region; and a second diffusion layer of the P type having a higher concentration than the first diffusion layer and formed in the semiconductor substrate at a position deeper than the first diffusion layer.

Since the insulated gate field effect transistor has the P type second diffusion layer of higher concentration than the first diffusion layer in the semiconductor substrate at a position deeper than the first diffusion layer, a neutral potential state can be created at a deep position in the semiconductor substrate. Thus, charge movement is reduced, thereby decreasing a tendency for punch-through and injection to occur.

According to the present invention, there is provided a method of manufacturing an insulated gate field effect transistor having a gate electrode on a semiconductor substrate with a gate insulating film interposed between the semiconductor substrate and the gate electrode, and having a source region and a drain region formed in the semiconductor substrate on both sides of the gate electrode, the method including: a step for forming in advance a first diffusion layer of a P type in the semiconductor substrate at a position deeper than a region where the source region and the drain region are formed in the semiconductor substrate; and a step for forming in advance a second diffusion layer of the P type having a higher concentration than the first diffusion layer and formed in the semiconductor substrate at a position deeper than the first diffusion layer.

Since the method of manufacturing the insulated gate field effect transistor forms the P type second diffusion layer of higher concentration than the first diffusion layer in the semiconductor substrate at a position deeper than the first diffusion layer, a neutral potential state can be created at a deep position in the semiconductor substrate. Thus, it is possible to manufacture an insulated gate field effect transistor that reduces charge movement and thereby decreases a tendency for punch-through and injection to occur.

According to the present invention, there is provided an image pickup device, in a charge coupled type image pickup device, wherein a part or all of insulated gate field effect transistors forming an output circuit in the image pickup device and formed in a semiconductor substrate include: a first diffusion layer of a P type formed in the semiconductor substrate at a position deeper than each source region and each drain region of the insulated gate field effect transistors; and a second diffusion layer of the P type having a higher concentration than the first diffusion layer and formed in the semiconductor substrate at a position deeper than the first diffusion layer.

Since the image pickup device uses the insulated gate field effect transistor according to the present invention for a part or all of the insulated gate field effect transistors forming the output circuit and formed in the semiconductor substrate, the insulated gate field effect transistors do not change a neutral potential state at a deep position in the substrate even when a high voltage is applied to the substrate to operate an electronic shutter of the image pickup device. Therefore effects of charge on a channel are suppressed.

According to the present invention, there is provided a method of manufacturing an image pickup device, in a method of manufacturing a charge coupled type image pickup device, the method performing, when forming a part or all of insulated gate field effect transistors forming an output circuit in the image pickup device: a step of forming in advance a first diffusion layer of a P type in a semiconductor substrate where the insulated gate field effect transistors are formed, at a position deeper than a region where each source region and each drain region of the drive transistor and the constant-current transistor are formed; and a step for forming in advance a second diffusion layer of the P type having a higher concentration than the first diffusion layer in the semiconductor substrate at a position deeper than the first diffusion layer.

Since the method of manufacturing the image pickup device forms a part or all of the insulated gate field effect transistors forming the output circuit of the image pickup device by the insulated gate field effect transistor according to the present invention, the insulated gate field effect transistors forming the output circuit do not change a neutral potential state at a deep position in the substrate even when a high voltage is applied to the substrate to operate an electronic shutter of the image pickup device. Therefore effects of charge on a channel are suppressed.

DETAILED DESCRIPTION OF THE PRESENTLY PREFERRED EMBODIMENTS

A first embodiment of an insulated gate field effect transistor according to the present invention will be described with reference to a schematic structure sectional view of FIG. 1.

Figure 1:
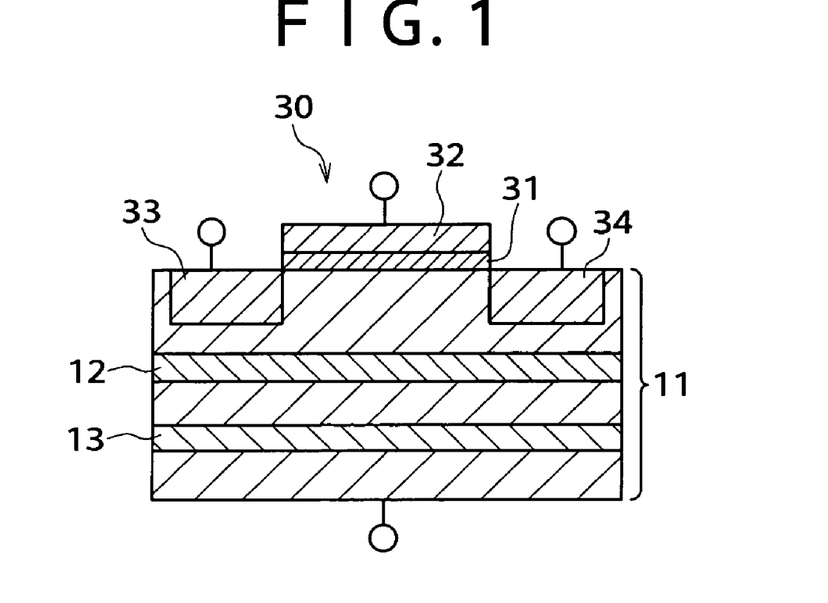
FIG. 1 is a schematic structure sectional view of a first embodiment of an insulated gate field effect transistor according to the present invention.

As shown in FIG. 1, a gate electrode 32 is formed on an N type semiconductor substrate 11 with a gate insulating film 31 interposed between the N type semiconductor substrate 11 and the gate electrode 32. A source region 33 and a drain region 34 of a P type are formed in the semiconductor substrate 11 on both sides of the gate electrode 32.

In addition, a $P^+$ type first diffusion layer 12 is formed in the semiconductor substrate 11 at a position deeper than the source region 33 and the drain region 34. The first diffusion layer 12 has a peak position of impurity concentration at a depth of 0.6 μm or less from a surface of the semiconductor substrate 11, preferably at a depth of 0.15 μm or more and 0.45 μm or less. The impurity concentration of the first diffusion layer 12 is $1 \times 10^{16}/cm^3$ or more and $6 \times 10^{16}/cm^3$ or less, preferably $1.5 \times 10^{16}/cm^3$ or more and $3 \times 10^{16}/cm^3$ or less.

Further, a $P^{++}$ type second diffusion layer 13 of a higher concentration than the first diffusion layer 12 is formed in the semiconductor substrate 11 at a position deeper than the first diffusion layer 12. The second diffusion layer 13 has a peak position of impurity concentration at a depth of 3 μm or more from the surface of the semiconductor substrate 11, preferably at a depth of 3.5 μm or more and 4.5 μm or less. The impurity concentration of the second diffusion layer 13 is $1.5 \times 10^{16}/cm^3$ or more and $6 \times 10^{16}/cm^3$ or less, preferably $2 \times 10^{16}/cm^3$ or more and $4 \times 10^{16}/cm^3$ or less. The insulated gate field effect transistor 30 is thus formed. The insulated gate field effect transistor 30 can be used as a drive transistor in an output circuit of an image pickup device.

Next, potential of the insulated gate field effect transistor according to the first embodiment will be described with reference to a potential diagram of FIG. 2.

Figure 2:
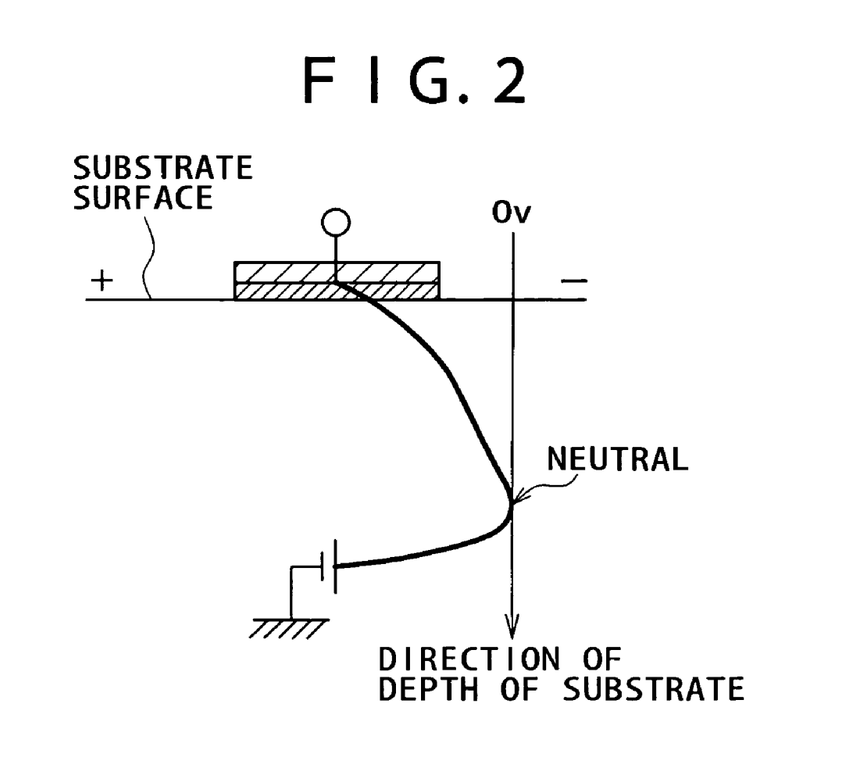
FIG. 2 is a diagram of potential under a channel of the insulated gate field effect transistor described in the first embodiment.

Since the insulated gate field effect transistor 30 has the P type second diffusion layer of higher concentration than the first diffusion layer in the semiconductor substrate at a position deeper than the first diffusion layer, a neutral potential state (a zero potential state) can be created at a deep position in the semiconductor substrate (substrate) 11, that is, at a position deeper than the P type second diffusion layer 13 of high concentration, as shown in FIG. 2. Thus, charge movement is reduced, thereby decreasing a tendency for punch-through and injection to occur. In a case where such a transistor is used as a drive transistor of a source follower type signal current amplifier circuit of an image pickup device, the neutral potential state is not changed even when a high voltage is applied to the substrate to operate an electronic shutter of the image pickup device. Therefore effects of charge on a channel are suppressed.

A second embodiment of an insulated gate field effect transistor according to the present invention will next be described with reference to a schematic structure sectional view of FIG. 3.

Figure 3:
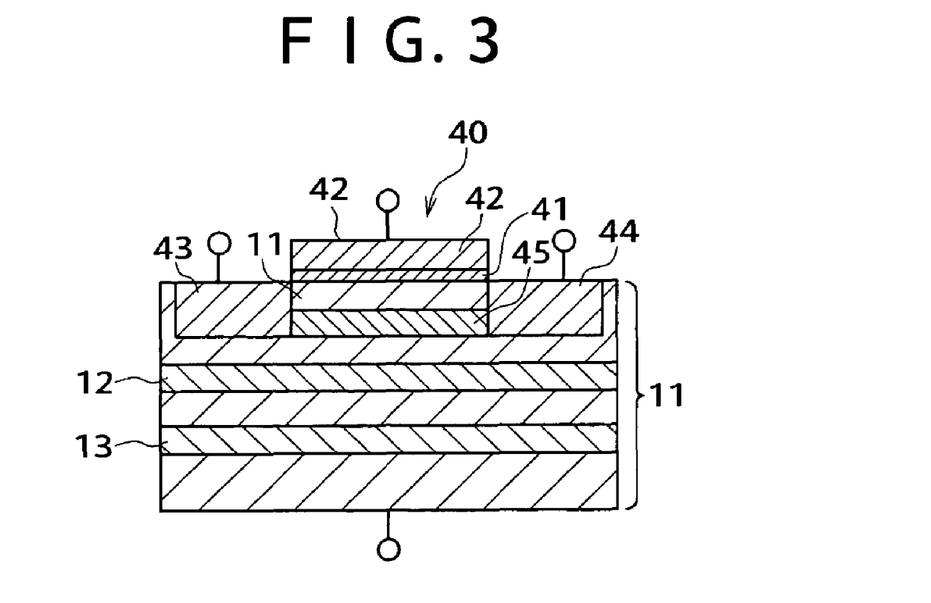
FIG. 3 is a schematic structure sectional view of a second embodiment of an insulated gate field effect transistor according to the present invention.

As shown in FIG. 3, a gate electrode 42 is formed on an N type semiconductor substrate 11 with a gate insulating film 41 interposed between the N type semiconductor substrate 11 and the gate electrode 42. A source region 43 and a drain region 44 of a P type are formed in the semiconductor substrate 11 on both sides of the gate electrode 42. In addition, an N type diffusion layer 45 is formed between the source region 43 and the drain region 44 in the semiconductor substrate 11 with a region of the semiconductor substrate 11 left on the gate electrode 42 side.

Further, a $P^+$ type first diffusion layer 12 is formed in the semiconductor substrate 11 at a position deeper than the source region 43 and the drain region 44. The first diffusion layer 12 has a peak position of impurity concentration at a depth of 0.6 μm or less from a surface of the semiconductor substrate 11, preferably at a depth of 0.15 μm or more and 0.45 μm or less. The impurity concentration of the first diffusion layer 12 is $1 \times 10^{16}/cm^3$ or more and $6 \times 10^{16}/cm^3$ or less, preferably $1.5 \times 10^{16}/cm^3$ or more and $3 \times 10^{16}/cm^3$ or less.

Further, a $P^{++}$ type second diffusion layer 13 of a higher concentration than the first diffusion layer 12 is formed in the semiconductor substrate 11 at a position deeper than the first diffusion layer 12. The second diffusion layer 13 has a peak position of impurity concentration at a depth of 3 μm or more from the surface of the semiconductor substrate 11, preferably at a depth of 3.5 μm or more and 4.5 μm or less. The impurity concentration of the second diffusion layer 13 is $1.5 \times 10^{16}/cm^3$ or more and $6 \times 10^{16}/cm^3$ or less, preferably $2 \times 10^{16}/cm^3$ or more and $4 \times 10^{16}/cm^3$ or less. The insulated gate field effect transistor 40 is thus formed. The insulated gate field effect transistor 40 can be used as a constant-current transistor or a reset gate transistor in an output circuit of an image pickup device.

Potential of the insulated gate field effect transistor according to the second embodiment will be described with reference to a potential diagram of FIG. 4.

Figure 4:
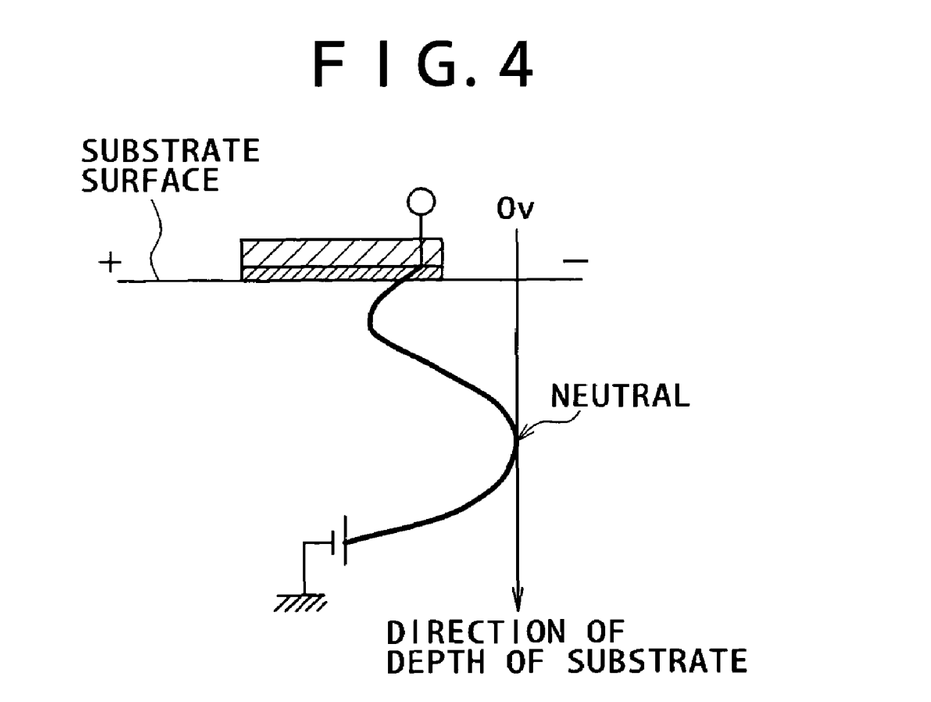
FIG. 4 is a diagram of potential under a channel of the insulated gate field effect transistor described in the second embodiment.

Since the insulated gate field effect transistor 40 has the P type second diffusion layer of higher concentration than the first diffusion layer in the semiconductor substrate at a position deeper than the first diffusion layer, a neutral potential state (a zero potential state) can be created at a deep position in the semiconductor substrate (substrate) 11, that is, at a position deeper than the P type second diffusion layer 13 of high concentration, as shown in FIG. 4. Thus, charge movement is reduced, thereby decreasing a tendency for punch-through and injection to occur. In a case where such a transistor is used as a drive transistor of a source follower type signal current amplifier circuit of an image pickup device, the neutral potential state is not changed even when a high voltage is applied to the substrate to operate an electronic shutter of the image pickup device. Therefore effects of charge on a channel are suppressed.

The insulated gate field effect transistors described with reference to FIG. 1 and FIG. 3 can be applied to MOS and MONOS transistors forming all circuits included in a CCD image pickup element.

A first embodiment of a method of manufacturing an insulated gate field effect transistor according to the present invention will be described with reference to a manufacturing process sectional view of FIG. 1.

As shown in FIG. 1, the following two steps are performed in advance before formation of a gate insulating film 31 and a gate electrode 32 on a semiconductor substrate 11 and a source region 33 and a drain region 34 of a 4P type in the semiconductor substrate 11.

In the first step, a first diffusion layer 12 is formed by doping the semiconductor substrate 11 with a P type impurity at a position deeper than a region where the source region 33 and the drain region 34 of the P type are formed. The first diffusion layer 12 is formed so as to have a peak position of impurity concentration at a depth of 0.6 μm or less from a surface of the semiconductor substrate 11, preferably at a depth of 0.15 μm or more and 0.45 μm or less. The impurity concentration of the first diffusion layer 12 is $1\times10^{16}/cm^3$ or more and $6\times10^{16}/cm^3$ or less, preferably $1.5\times10^{16}/cm^3$ or more and $3\times10^{16}/cm^3$ or less. The doping of the semiconductor substrate 11 with the impurity is performed by an ion implantation method, for example. A dose, implantation energy and the like at the time of the doping are set appropriately so as to attain the peak position of impurity concentration and the impurity concentration.

In the second step, a $P^{++}$ type second diffusion layer 13 of a higher concentration than the first diffusion layer 12 is formed in the semiconductor substrate 11 at a position deeper than the first diffusion layer 12. The second diffusion layer 13 is formed so as to have a peak position of impurity concentration at a depth of 3 μm or more from the surface of the semiconductor substrate 11, preferably at a depth of 3.5 μm or more and 4.5 μm or less. The impurity concentration of the second diffusion layer 13 is $1.5\times10^{16}/cm^3$ or more and $6\times10^{16}/cm^3$ or less, preferably $2\times10^{16}/cm^3$ or more and $4\times10^{16}/cm^3$ or less. The doping of the semiconductor substrate 11 with the impurity is performed by an ion implantation method, for example. A dose, implantation energy and the like at the time of the doping are set appropriately so as to attain the peak position of impurity concentration and the impurity concentration. For example, the doping can be realized by implanting a P type impurity (for example boron ($B^+$) or boron difluoride ($BF2^+$)) with a high energy of 3 MeV or higher and a dose of $1\times10^{12}/cm^2$ or more.

Thereafter the gate insulating film 31 and the gate electrode 32, and the source region 33 and the drain region 34 of the 4P type are formed on and in the semiconductor substrate 11 by common transistor forming techniques. Incidentally, either of the first step for forming the first diffusion layer 12 and the second step for forming the second diffusion layer 13 may be performed first.

Since the method of manufacturing the insulated gate field effect transistor 30 forms the $P^{++}$ type second diffusion layer 13 of higher concentration than the first diffusion layer 12 in the semiconductor substrate 11 at a position deeper than the first diffusion layer 12, a neutral potential state (a zero potential state) can be created at a deep position in the semiconductor substrate 11, that is, at a position deeper than the P type second diffusion layer 13 of high concentration. Thus, charge movement is reduced, thereby decreasing a tendency for punch-through and injection to occur. In a case where such a transistor is used as a drive transistor of a source follower type signal current amplifier circuit of an image pickup device, the neutral potential state is not changed even when a high voltage is applied to the substrate to operate an electronic shutter of the image pickup device. Therefore effects of charge on a channel are suppressed.

A second embodiment of a method of manufacturing an insulated gate field effect transistor according to the present invention will be described with reference to a manufacturing process sectional view of FIG. 3.

As shown in FIG. 3, in the method of manufacturing the insulated gate field effect transistor 40, as in the first embodiment, a first step is performed to form a first diffusion layer 12 by doping a semiconductor substrate 11 with a P type impurity at a position deeper than a region where a source region 43 and a drain region 44 of a P type are formed in the semiconductor substrate 11, and a second step is performed to form a $P^{++}$ type second diffusion layer 13 of a higher concentration than the first diffusion layer 12 in the semiconductor substrate 11 at a position deeper than the first diffusion layer 12. Thereafter an N type diffusion layer 45 is formed in a region between the source region 43 and the drain region 44 of the semiconductor substrate 11 at a position shallower than the first diffusion layer 12 with a region of the semiconductor substrate 11 left on a surface side of the semiconductor substrate 11. Incidentally, the order in which the first diffusion layer 12, the second diffusion layer 13, and the N type diffusion layer 45 are formed is one example; any of the diffusion layers may be formed first, and the diffusion layers may be formed in any order. Thereafter, it suffices to form a gate insulating film 41 and a gate electrode 42 on the semiconductor substrate 11, and the source region 43 and the drain region 44 of the P type by common transistor forming techniques.

Since the method of manufacturing the insulated gate field effect transistor 40 forms the $P^{++}$ type second diffusion layer 13 of higher concentration than the first diffusion layer 12 in the semiconductor substrate 11 at a position deeper than the first diffusion layer 12, a neutral potential state (a zero potential state) can be created at a deep position in the semiconductor substrate 11, that is, at a position deeper than the P type second diffusion layer 13 of high concentration. Thus, charge movement is reduced, thereby decreasing a tendency for punch-through and injection to occur. In a case where such a transistor is used as a constant-current transistor of a source follower type signal current amplifier circuit of an image pickup device, the neutral potential state is not changed even when a high voltage is applied to the substrate to operate an electronic shutter of the image pickup device. Therefore effects of charge on a channel are suppressed.

An embodiment of an image pickup device according to the present invention will be described with reference to (1) a diagram showing the whole of a CCD image pickup device and (2) a diagram of an output circuit in FIG. 5, and FIG. 1 and FIG. 3.

Figure 5:
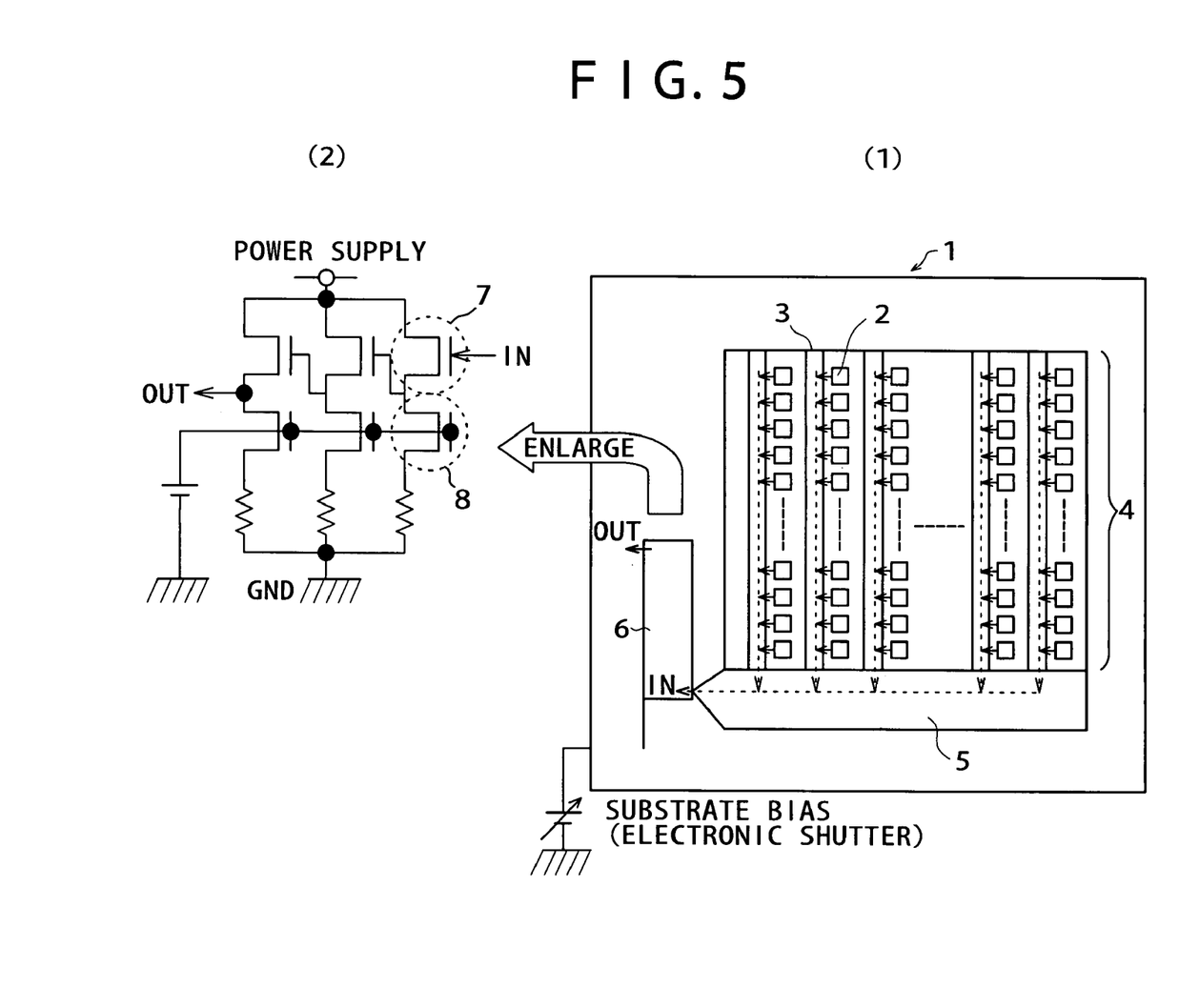
FIG. 5 is (1) a diagram of the whole of a CCD image pickup device and (2) a diagram of an output circuit, showing an embodiment of an image pickup device according to the present invention.

As shown in FIG. 5, the image pickup device 1 roughly includes: a light receiving unit 4 including light receiving sensors 2 arranged in a form of a matrix and a vertical register 3 disposed so as to be adjacent to each column of light receiving sensors; a horizontal register 5; and an output circuit unit 6. When light enters the image pickup device 1, the light is converted into electric signals by the light receiving sensors 2 of the light receiving unit 4. The electric signals are outputted from the output circuit 6 via the vertical register 3 and the horizontal register 5. Arrows in the figure show a direction of signal transfer.

As shown in FIG. (2), the output circuit 6 is a source follower type signal current amplifier circuit. A drive transistor 7 in the source follower type signal current amplifier circuit includes the insulated gate field effect transistor 30 having the structure described with reference to FIG. 1, and a constant-current transistor 8 in the source follower type signal current amplifier circuit includes the insulated gate field effect transistor 40 having the structure described with reference to FIG. 3. Also, though not shown, a reset gate transistor in the image pickup device 1 can employ the structure of the insulated gate field effect transistor 40 described with reference to FIG. 3. Thus, the image pickup device 1 can employ the insulated gate field effect transistor described with reference to FIG. 1 or FIG. 3 for a part or all of insulated gate field effect transistors forming the output circuit 6 of the image pickup device 1 and formed in a semiconductor substrate.

Since the image pickup device 1 uses the insulated gate field effect transistor according to the present invention for a part or all of drive transistors forming the output circuit 6 and formed in the semiconductor substrate, a neutral potential state of the insulated gate field effect transistor at a deep position in the semiconductor substrate is not changed even when a high voltage is applied to the semiconductor substrate to operate an electronic shutter of the image pickup device 1. Therefore effects of charge on a channel are suppressed. This will be described in the following.

Potential of a drive transistor in the embodiment of the image pickup device 1 will be described with reference to a potential diagram of FIG. 6.

Figure 6:
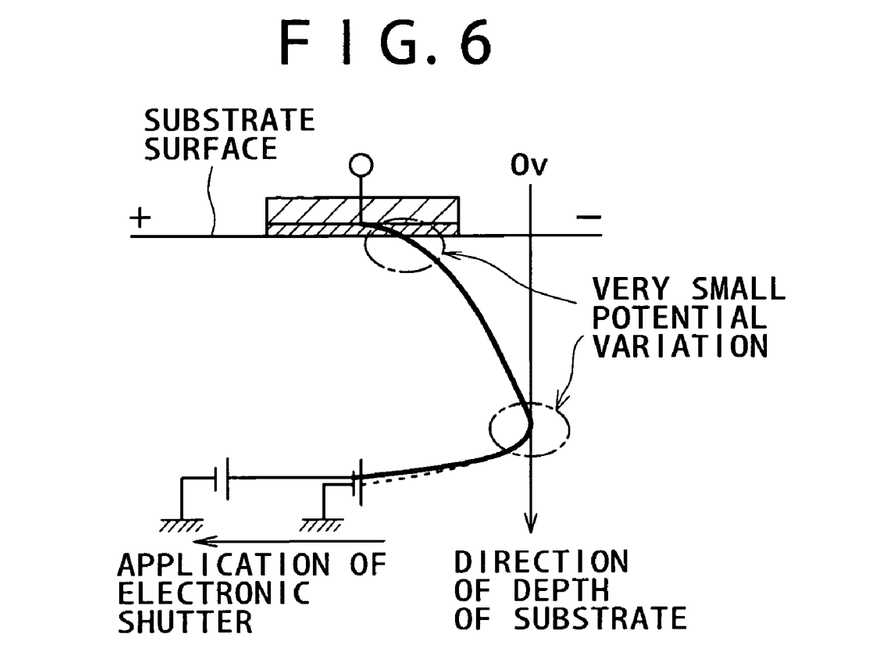
FIG. 6 is a diagram of potential under a channel of a drive transistor according to the embodiment of the image pickup device.

Since the drive transistor 7 (the insulated gate field effect transistor 30) has the P type second diffusion layer 13 of higher concentration than the first diffusion layer 12 in the semiconductor substrate 11 at a position deeper than the first diffusion layer 12, a neutral potential state (a zero potential state) can be created at a deep position in the semiconductor substrate 11, that is, at a position deeper than the P type second diffusion layer 13 of high concentration, as shown in FIG. 6. Thereby even when the electronic shutter is applied, potential variation is very small, a back gate is neutral in an entire range of normal operation, and a back gate effect and a charge inflow between a channel and the semiconductor substrate do not occur. In addition, since a P type impurity is implanted with high energy to form the second diffusion layer 13, a coupling capacitance formed with the channel is very small, thus producing no effects on the potential variation and gain characteristics of the transistor. Thus, charge movement is reduced, thereby decreasing a tendency for punch-through and injection to occur. Thus, the neutral potential state is not changed even when a high voltage is applied to the semiconductor substrate 11 to operate the electronic shutter of the image pickup device 1. Therefore effects of charge on a channel are suppressed, whereby an output of stable picked-up image quality is obtained. In the drawing, a potential curve represented by a broken line is a potential curve before application of the electronic shutter, and a potential curve represented by a solid line is a potential curve after the application of the electronic shutter.

Next, potential of a constant-current transistor in the embodiment of the image pickup device 1 will be described with reference to a potential diagram of FIG. 7.

Figure 7:
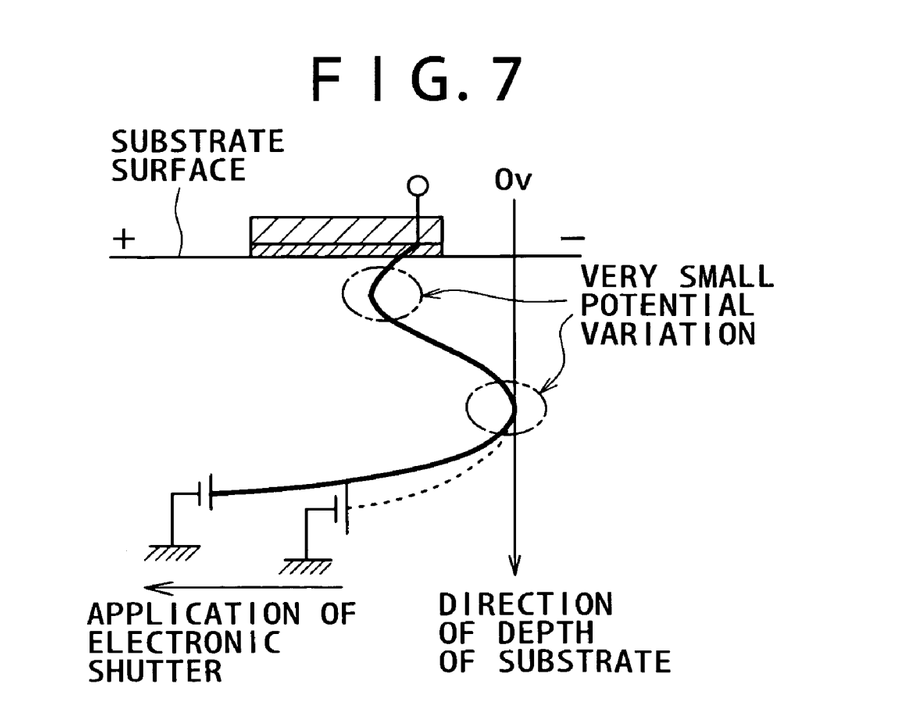
FIG. 7 is a diagram of potential under a channel of a constant-current transistor according to the embodiment of the image pickup device.

As shown in FIG. 7, since the constant-current transistor 8 (the insulated gate field effect transistor 40) has the P type second diffusion layer 13 of higher concentration than the first diffusion layer 12 in the semiconductor substrate 11 at a position deeper than the first diffusion layer 12, a neutral potential state (a zero potential state) can be created at a deep position in the semiconductor substrate 11, that is, at a position deeper than the P type second diffusion layer 13 of high concentration. Thereby, potential variation is very small, a back gate is neutral in an entire range of normal operation, and a back gate effect and a charge inflow between a channel and the semiconductor substrate do not occur. In addition, since a P type impurity is implanted with high energy to form the second diffusion layer 13, a coupling capacitance formed with the channel is very small, thus producing no effects on the potential variation and gain characteristics of the transistor. Thus, charge movement is reduced, thereby decreasing a tendency for punch-through and injection to occur. Thus, the neutral potential state is not changed even when a high voltage is applied to the semiconductor substrate 11 to operate an electronic shutter of the image pickup device 1. Therefore effects of charge on a channel are suppressed, whereby an output of stable picked-up image quality is obtained. In the drawing, a potential curve represented by a broken line is a potential curve before application of the electronic shutter, and a potential curve represented by a solid line is a potential curve after the application of the electronic shutter.

A method of manufacturing the image pickup device according to the present invention will next be described. The method of manufacturing the image pickup device according to the present invention performs the following two steps in advance when a part or all of insulated gate field effect transistors forming an output circuit of the image pickup device are formed in a method of manufacturing a generally known charge coupled type image pickup device. The first step is a step of forming a P type first diffusion layer in a semiconductor substrate where an insulated gate field effect transistor is formed, at a position deeper than a region where a source region and a drain region of the insulated gate field effect transistor are formed in the semiconductor substrate. The second step is a step of forming a P type second diffusion layer of a higher concentration than the first diffusion layer in the semiconductor substrate at a position deeper than the first diffusion layer. Either of the first step and the second step may be performed first.

A process of forming an output circuit part of the image pickup device will next be described with reference to a flowchart of FIG. 8.

Figure 8:
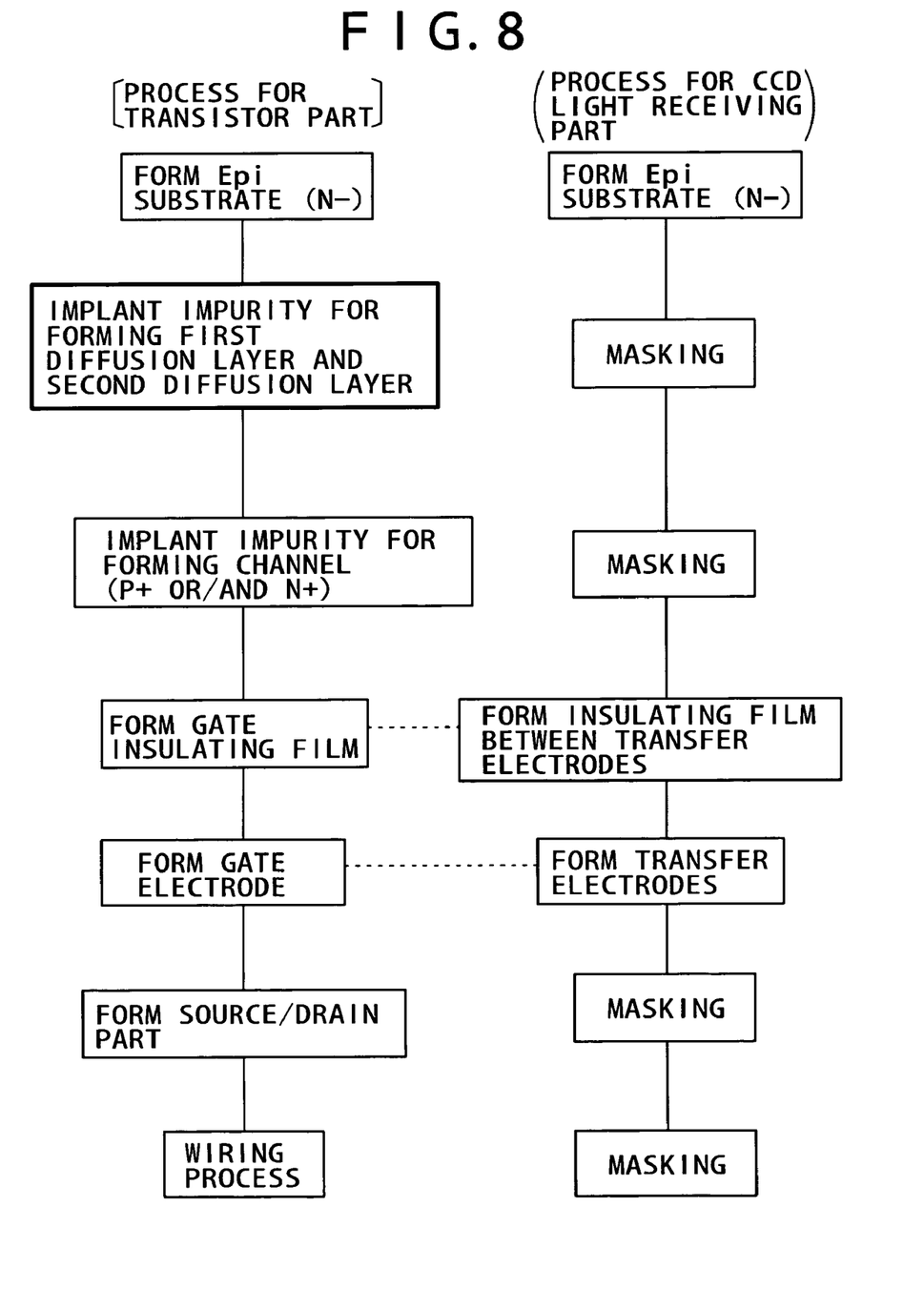
FIG. 8 is a flowchart of an embodiment of a method of manufacturing the image pickup device according to the present invention.

As shown in FIG. 8, an epitaxial (Epi) substrate having an N-type epitaxial layer is formed first. Next, a region for forming a CCD light receiving part is masked, and impurity doping for forming a first diffusion layer and a second diffusion layer in a transistor forming region of the output circuit is performed by an ion implantation method, for example. At this time, a position of a peak of impurity concentration and impurity concentration of the first diffusion layer, and a position of a peak of impurity concentration and impurity concentration of the second diffusion layer are the same as the conditions of the insulated gate field effect transistors described earlier with reference to FIG. 1 and FIG. 3.

Next, the transistor forming region in the semiconductor substrate is doped with an impurity for forming a channel. Also at this time, the region for forming the CCD light receiving part is masked.

Next, after removing the mask used for the doping, a gate insulating film is formed in the transistor forming region of the output circuit, and an insulating film is formed between transfer electrodes of the light receiving part. Then, a gate electrode is formed in the transistor forming region of the output circuit, and the transfer electrodes of the light receiving part are formed.

Next, the light receiving region is masked, and diffusion layers are formed as a source and a drain in the transistor forming region. Further, the light receiving region is masked, and a process of wiring in the transistor forming region is performed.

In the method of manufacturing the image pickup device, since a part or all of insulated gate field effect transistors forming the output circuit of the image pickup device are formed by the insulated gate field effect transistor according to the present invention, the insulated gate field effect transistors forming the output circuit do not change a neutral potential state at a deep position in the substrate even when a high voltage is applied to the substrate to operate an electronic shutter of the image pickup device. Therefore effects of charge on the channel are suppressed.

As described above, since the insulated gate field effect transistor according to the present invention has the P type second diffusion layer of higher concentration than the first diffusion layer in the semiconductor substrate at a position deeper than the first diffusion layer, a neutral potential state can be created at a deep position in the semiconductor substrate. Thus, charge movement is reduced, thereby decreasing a tendency for punch-through and injection to occur. In a case where such a transistor is used as a drive transistor of a source follower type signal current amplifier circuit of an image pickup device, the neutral potential state is not changed even when a high voltage is applied to the substrate to operate an electronic shutter of the image pickup device. Therefore effects of charge on a channel can be suppressed.

Since the method of manufacturing the insulated gate field effect transistor according to the present invention forms the P type second diffusion layer of higher concentration than the first diffusion layer in the semiconductor substrate at a position deeper than the first diffusion layer, a neutral potential state can be created at a deep position in the semiconductor substrate. Thus, it is possible to manufacture an insulated gate field effect transistor that reduces charge movement and thereby decreases a tendency for punch-through and injection to occur. In a case where such an insulated gate field effect transistor is formed as a transistor of a source follower type signal current amplifier circuit of a solid-state image pickup device, the neutral potential state is not changed even when a high voltage is applied to the substrate to operate an electronic shutter of the image pickup device. It is therefore possible to form a transistor in which effects of charge on a channel are suppressed.

Since the image pickup device according to the present invention uses the insulated gate field effect transistor according to the present invention for a part or all of insulated gate field effect transistors forming an output circuit and formed in a semiconductor substrate, the insulated gate field effect transistors do not change a neutral potential state at a deep position in the substrate even when a high voltage is applied to the substrate to operate an electronic shutter of the image pickup device. Therefore effects of charge on a channel can be suppressed. It is thus possible to eliminate occurrence of the problem of a shutter step. It is also possible to eliminate occurrence of problems caused by punch-through and injection to and from the semiconductor substrate in a transistor and a reset gate forming a circuit included in the image pickup device.

Since the method of manufacturing the image pickup device according to the present invention forms a part or all of insulated gate field effect transistors forming the output circuit of the image pickup device by the insulated gate field effect transistor according to the present invention, the insulated gate field effect transistors forming the output circuit do not change a neutral potential state at a deep position in the substrate even when a high voltage is applied to the substrate to operate an electronic shutter of the image pickup device. Therefore effects of charge on a channel can be suppressed. It is thus possible to manufacture an image pickup device that can eliminate occurrence of the problem of a shutter step. It is also possible to manufacture an image pickup device that eliminates occurrence of problems caused by punch-through and injection to and from the semiconductor substrate in a transistor and a reset gate forming a circuit included in the image pickup device.

The invention claimed is:

1. A method of manufacturing an image pickup device having at least one insulated gate field effect transistor in an output circuit of the image pickup device and that is formed in a substrate, said method comprising the steps of:

forming, prior to forming said insulated gate field effect transistor, a first diffusion layer of a first conduction type in said substrate beneath where said insulated gate field effect transistor is to be formed, at a position deeper than a region where a source region and a drain region of said insulated gate field effect transistor are to be formed, the first diffusion layer underlying an entire area of said source region and an entire area of said drain region and entirely separated from said source region and said drain region; and forming, prior to forming said insulated gate field effect transistor and after forming the first diffusion layer, a second diffusion layer of the first conduction type having a higher concentration than said first diffusion layer in said substrate at a position deeper than said first diffusion layer, the second diffusion layer being entirely separated from said first diffusion layer by an intervening layer having a conduction type that is different than the first conduction type.

* * * * *